US012787162B2

(12) United States Patent
Honda

(10) Patent No.: US 12,787,162 B2
(45) Date of Patent: Nov. 3, 2026

(54) CIRCUIT BOARD AND IMAGE FORMING APPARATUS

(71) Applicant: CANON KABUSHIKI KAISHA, Tokyo (JP)

(72) Inventor: Takeshi Honda, Chiba (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 19/174,654

(22) Filed: Apr. 9, 2025

(65) Prior Publication Data

US 2025/0240881 A1 Jul. 24, 2025

Related U.S. Application Data

(63) Continuation of application No. 18/454,264, filed on Aug. 23, 2023, now Pat. No. 12,295,096.

(30) Foreign Application Priority Data

Aug. 29, 2022 (JP) ................................ 2022-135596

(51) Int. Cl.

| | |
|---|---|
| ***G03G 15/00*** | (2006.01) |
| ***H02K 11/33*** | (2016.01) |
| ***H05K 1/02*** | (2006.01) |
| ***H05K 1/11*** | (2006.01) |
| ***H05K 1/18*** | (2006.01) |
| *H02M 3/00* | (2006.01) |

(52) U.S. Cl.

CPC ........... *H05K 1/0292* (2013.01); *G03G 15/65* (2013.01); *G03G 15/80* (2013.01); *H02K 11/33* (2016.01); *H05K 1/0298* (2013.01); *H05K 1/115* (2013.01); *H05K 1/18* (2013.01); *H02K 2211/03* (2013.01); *H02M 3/003* (2021.05); *H05K 2201/10689* (2013.01)

(58) Field of Classification Search

CPC ...... G03G 15/65; G03G 15/80; H05K 1/0292; H05K 1/0298; H05K 1/115; H05K 1/18; H05K 2201/10689; H02K 11/33; H02K 2211/03; H02M 3/003

See application file for complete search history.

(56) References Cited

U.S. PATENT DOCUMENTS 10,716,201 B2 7/2020 Park
11,807,486 B2 11/2023 Arima
(Continued)

FOREIGN PATENT DOCUMENTS

JP 2021-164356 A 10/2021
JP 2022-6639 A 1/2022

*Primary Examiner* — Sophia S Chen

(74) *Attorney, Agent, or Firm* — VENABLE LLP

(57) ABSTRACT

A circuit board for an image forming apparatuses to which a first integrated circuit or a second integrated circuit is provided, includes an electric part provided to a first surface of the circuit board, a first attachment part provided to the first surface, to which at least one terminal of the first integrated circuit is attachable, a first conductor pattern formed on the first surface and configured to constitute at least a portion of a first wiring which connects the first attachment part and the electric part, a second attachment part provided to a second surface opposite to the first surface of the circuit board, to which at least one terminal of the second integrated circuit is attachable.

18 Claims, 7 Drawing Sheets

(56) References Cited

U.S. PATENT DOCUMENTS

| | | | | |
|---|---|---|---|---|
| 2018/0084634 | A1* | 3/2018 | Davis | H05K 1/029 |
| 2018/0103542 | A1 | 4/2018 | Shinotsuka | |
| 2019/0289758 | A1 | 9/2019 | Furuya | |

* cited by examiner

CIRCUIT BOARD AND IMAGE FORMING APPARATUS

This application is a continuation of U.S. application Ser. No. 18/454,264, filed Aug. 23, 2023, the contents of which is incorporated herein by reference.

BACKGROUND OF THE INVENTION

Field of the Invention

The present disclosure relates to a circuit board to which an electric part is implemented and an image forming apparatus having the circuit board.

Description of the Related Art

An image forming apparatus includes a plurality of circuit boards for control to control two or more actuators provided for image forming. On the circuit board for control, two or more electric parts, such as an electric part for performing a logical operation, an electric part for performing a drive control, and an electric part for generating a power supply voltage, and the like are implemented. Each electric part constitutes an electric part component, which includes surrounding electric parts and realizes a predetermined function. For example, an integrated circuit (IC) and a peripheral electric component, such as a resistance to be connected to an input/output terminal of the IC, a capacitor, an inductor, and the like constitute the electric part component.

A circuit board is manufactured by procuring and mounting many electric parts. However, due to various reasons such as circulation, environment, and an accident, etc., acquisition of electric parts may become difficult. For example, these days, an insufficient supply of ICs has become a problem. In order to avoid such a situation, for each electric part, a part that has the same function, the same shape, and the same specification, or a similar substitutable part is investigated previously. In a case where a problem concerning parts procurement has occurred, the substitutable part is procured. The manufacture of the circuit board is continued using the substitutable part.

The image forming apparatus prints an image on a sheet by performing two or more processes such as conveying a sheet, forming an image, transferring the image on the sheet, and fixing the image on the sheet, etc. Therefore, the image forming apparatus needs to control various actuators, such as an optical sensor, a temperature sensor, a motor, and a solenoid, etc. In the circuit board for control to be provided to the image forming apparatus, two or more ICs are implemented for controlling the actuators. For example, a motor driver board for driving a motor includes an IC for generating a motor drive signal based on a control signal to control the motor appropriately input from a controller (Japanese Patent Application Laid-open No. 2022-006639). Further, two or more circuit boards for control themselves are also provided in the image forming apparatus.

In the circuit board for control, required voltage values may differ according to the actuators to be connected. Therefore, to the circuit board, two or more electric part components for voltage generation, which generate different voltage values, are implemented. In this configuration, the power supply voltages of different voltage values are generated in the circuit board for control. As an electric part component for voltage generation, an IC of a DC/DC converter with low heat loss is used widely (Japanese Patent Application Laid-open No. 2021-164356).

In many cases, the IC of a DC/DC converter and an IC of a motor driver need peripheral parts for achieving normal operation. Moreover, in most cases, as to the IC of the DC/DC converter and the IC of the motor driver, a function of a terminal and an electric specification differs for each IC. Therefore, in a case where one IC is replaced with another IC, since a required peripheral part, a terminal function, and a voltage value, etc., are different from each other, normal operation is not likely to be guaranteed.

Therefore, in a circuit board for realizing a predetermined function, an electric part component consisting of an IC and a peripheral part (electric part) to supplement a function of the IC is implemented. Moreover, in many cases, the wiring (conductor pattern) on the circuit board is unique to the IC. In a case where one IC is replaced with another IC, a peripheral part and wiring (conductor pattern) corresponding to the IC to replace are needed. That is, to replace one IC with another IC, it is necessary to perform the design of the circuit board. Therefore, in the circuit board for realizing the predetermined function, the IC cannot be replaced easily.

SUMMARY OF THE INVENTION

A circuit board for an image forming apparatuses to which a first integrated circuit or a second integrated circuit is provided according to the present disclosure includes an electric part provided to a first surface of the circuit board, a first attachment part provided to the first surface, to which at least one terminal of the first integrated circuit is attachable, a first conductor pattern formed on the first surface and configured to constitute at least a portion of a first wiring which connects the first attachment part and the electric part, a second attachment part provided to a second surface opposite to the first surface of the circuit board, to which at least one terminal of the second integrated circuit is attachable, a second conductor pattern formed on the second surface and configured to constitute at least a first portion of a second wiring which connects the second attachment part and the electric part, and a via penetrating through the circuit board and configured to constitute a second portion of the second wiring.

Further, according to another embodiment of the present disclosure, there is provided an image forming apparatus comprising,

- a voltage conversion unit, having a circuit board to which a first integrated circuit or a second integrated circuit is provided, configured to convert a value of a voltage input to the circuit board, and, a control unit configured to control the image forming apparatus based on the voltage converted by the voltage conversion unit, wherein the circuit board comprises, an electric part provided to a first surface of the circuit board, a first attachment part provided to the first surface, to which at least one terminal of the first integrated circuit is attachable, a first conductor pattern formed on the first surface and configured to constitute at least a portion of a first wiring which connects the first attachment part and the electric part, a second attachment part provided to a second surface opposite to the first surface of the circuit board, to which at least one terminal of the second integrated circuit is attachable, a second conductor pattern formed on the second surface and configured to constitute at least a first portion of a second wiring which connects the second attachment part and the electric part, and a via configured to penetrate through the circuit board and constitute a second portion of the second wiring.

Further, according to yet another embodiment of the present disclosure, there is provided an image forming apparatus comprising, a rotation member configured to rotate to form an image on a sheet, a drive source, and a circuit board to which a first integrated circuit or a second integrated circuit is provided, wherein the circuit board comprises, an electric part provided to a first surface of the circuit board, a first attachment part provided to the first surface, to which at least one terminal of the first integrated circuit is attachable, a first conductor pattern formed on the first surface and configured to constitute at least a portion of a first wiring which connects the first attachment part and the electric part, a second attachment part provided to a second surface opposite to the first surface of the circuit board, to which at least one terminal of the second integrated circuit is attachable, a second conductor pattern formed on the second surface and configured to constitute at least a first portion of a second wiring which connects the second attachment part and the electric part, and a via configured to penetrate through the circuit board and constitute a second portion of the second wiring.

Further features of the present invention will become apparent from the following description of exemplary embodiments (with reference to the attached drawings).

DESCRIPTION OF THE EMBODIMENTS

Hereinafter, embodiments for carrying out the present disclosure will be described with reference to the drawings. Note that a configuration of an apparatus or a circuit described in this embodiment is simply an example. Therefore, not limited to this, other configurations or determination procedures may be adopted.

<Configuration of Image Forming Apparatus>

Figure 1:
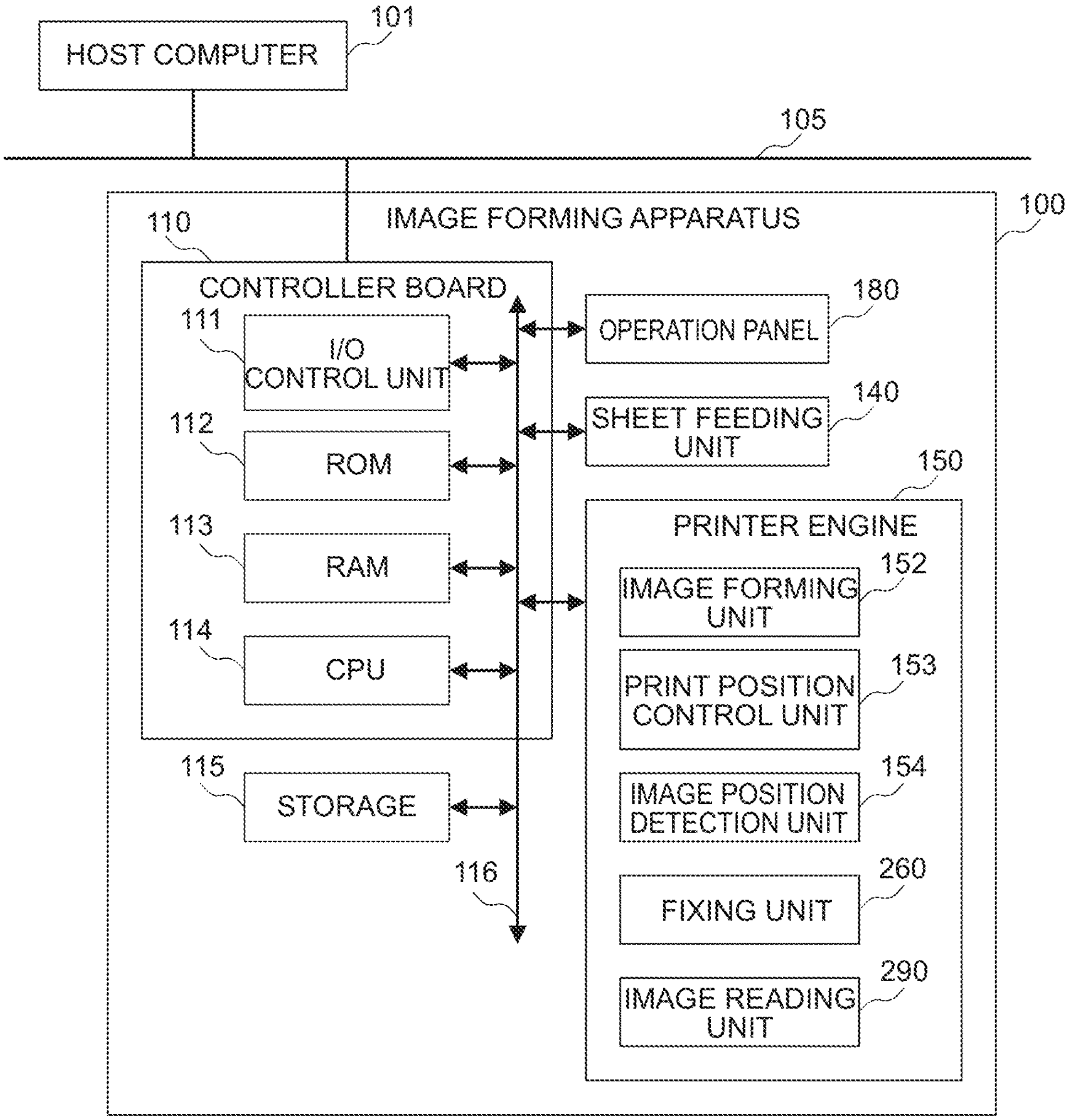
FIG. 1 is a system configuration diagram of an image forming apparatus.

FIG. 1 is a system configuration diagram of an image forming apparatus having a circuit board of this embodiment. Unless otherwise noted, the image forming apparatus 100 may be a system constituted by two or more apparatus connected through a network, as long as functions of the image forming apparatus 100 are achieved.

Thus, the image forming apparatus 100 according to this embodiment is communicably connected to a host computer 101 via a network 105. The network 105 includes a communication line such as a local area network (LAN), a wide area network (WAN), and a public communication line. A plurality of the image forming apparatuses 100 and a plurality of the host computers 101 may be connected to the network 105, respectively. The host computer 101 generates a print job and transmits the print job to the image forming apparatus 100 through the network 105.

The image forming apparatus 100 includes a controller board 110, a storage 115, a sheet feeding unit 140, a printer engine 150, and an operation panel 180. The controller board 110, the storage 115, the sheet feeding unit 140, the printer engine 150, and the operation panel 180 are communicably connected to each other via a system bus 116.

The controller board 110 includes an I/O control unit 111, a Read Only Memory (ROM) 112, a Random Access Memory (RAM) 113, and a Central Processing Unit (CPU) 114. The I/O control unit 111, the ROM 112, the RAM 113, and the CPU 114 are implemented to a circuit board. The controller board 110 functions as a main control unit of the image forming apparatus 100 and controls the operation of the entire image forming apparatus 100. The circuit board is a multilayer printed circuit board.

The I/O control unit 111 controls the communication with an external device such as the host computer 101 via the network 105. The CPU 114 controls, by executing a computer program stored in the ROM 112 or the storage 115, an operation such as an image forming process by the image forming apparatus 100. The RAM 113 provides a work area when the CPU 114 performs processing and performs a storing process of temporal data and the like. The storage 115 stores mass data such as image data and print data, etc., temporarily or long term. For example, the storage 115 stores image data for generating an adjustment image for adjusting an image forming condition. A control program and an operating system, both to be executed by the CPU 114, are stored in the ROM 112 and the storage 115.

The operation panel 180 is a user interface including an input interface and an output interface. The input interface includes key buttons and a touch panel, and the like. The output interface includes a display, a speaker, and the like. The operation panel 180 receives an instruction etc., by an operation of a user, and inputs it into the CPU 114. The CPU 114 controls the operation of the image forming apparatus 100 according to the input instruction. Further, the operation panel 180 displays a state and various setting screens of the image forming apparatus 100 according to an instruction from the CPU 114.

The sheet feeding unit 140 includes a sheet feeding apparatus, which includes one or more sheet feeding cassettes, and a conveyance unit as a whole, which conveys a sheet from the sheet feeding cassette to a sheet discharge unit. The sheet feeding unit 140 feeds one sheet at a time from the sheet feeding cassette according to an instruction from the CPU 114.

The printer engine 150 includes an image forming unit 152, a print position control unit 153, an image position detection unit 154, a fixing unit 260, and an image reading unit 290. The image forming unit 152 forms an image (toner image) on the sheet fed by the sheet feeding unit 140. The fixing unit 260 fixes the image (toner image) on the sheet. The image reading unit 290 reads the adjustment image printed by the image. The image position detection unit 154 detects an image position on the sheet based on the reading result of the adjustment image by the image reading unit 290. The print position control unit 153 controls the image position of the image to be formed on the sheet based on the image position detected by the image position detection unit 154.

Figure 2:
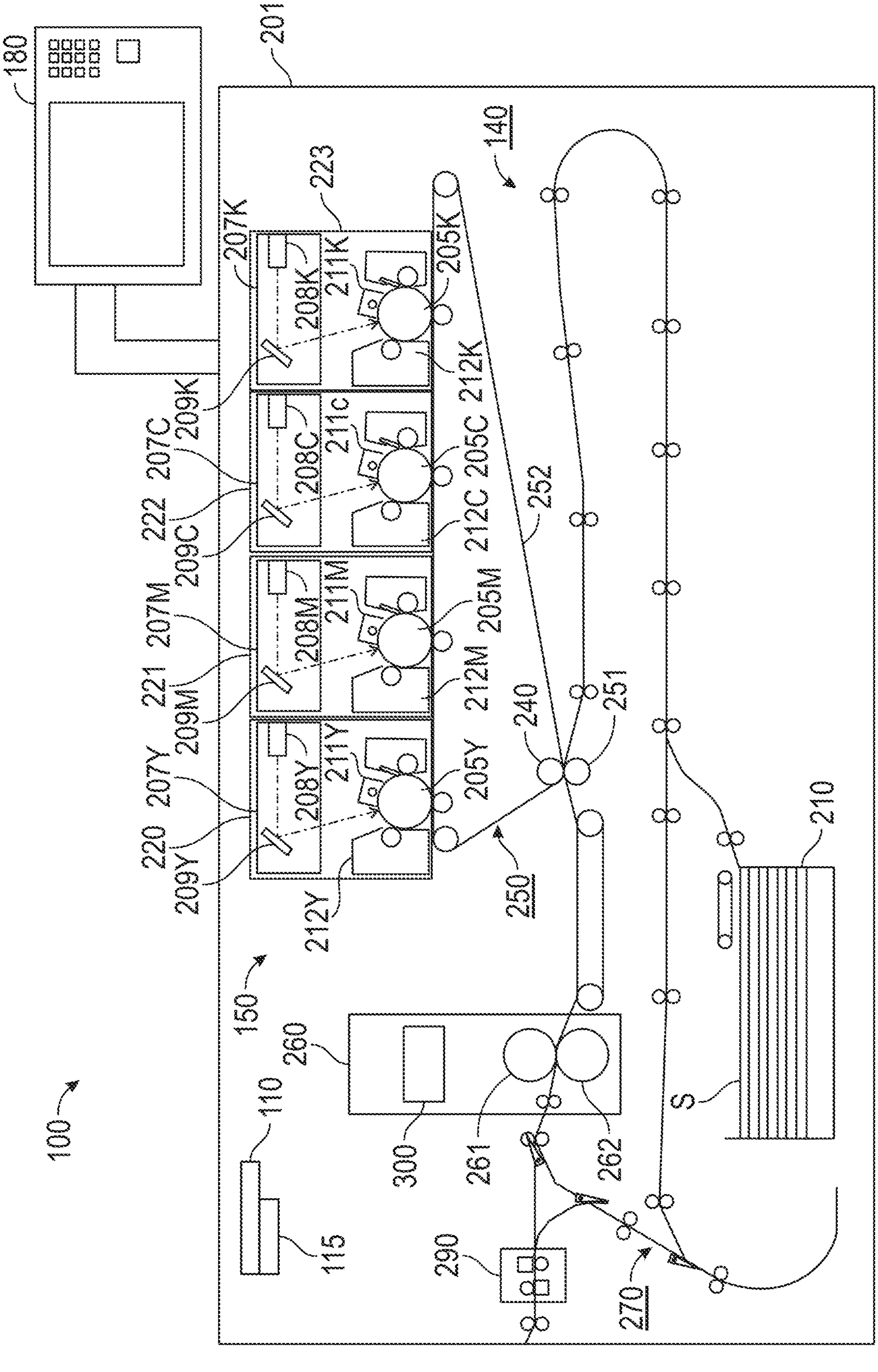
FIG. 2 is a configuration diagram of the image forming apparatus.

FIG. 2 is a configuration diagram of the image forming apparatus 100. The image forming apparatus 100 has the operation panel 180 on an upper portion of a housing 201. In the housing 201, the controller board 110, the storage 115, the sheet feeding unit 140, and the printer engine 150, illustrated in FIG. 1, are provided. In the printer engine 150, mechanisms that constitute an engine unit, and an engine control unit that controls a process by each mechanism are installed. The mechanisms which constitute the engine unit include an optical process mechanism and a fixing process mechanism. The optical process mechanism performs to form an electrostatic latent image, develop the electrostatic latent image, and transfer the developed image on the sheet. The fixing process mechanism fixes the transferred toner image onto the sheet.

The image forming unit 152 of the printer engine 150 corresponds to the optical process mechanism and includes a Y station 220, an M station 221, a C station 222, a K station 223, an intermediate transfer belt 252, and a secondary transfer outer roller 251. The Y station 220, the M station 221, the C station 222, and the K station 223 has the same configuration, and only the color of the image to be formed is different. The Y station 220 forms a yellow image. The M station 221 forms a magenta image. The C station 222 forms a cyan image. The K station 223 forms a black image. Here, the configuration of the Y station 220 is explained and an explanation of the constitution of the M station 221, the C station 222, and the K station 223 is omitted.

The Y station 220 includes a photosensitive drum 205Y, a charging unit 211Y, an exposure unit 207Y, and a developing unit 212Y. The photosensitive drum 205Y is a drum-shaped photosensitive member having a photosensitive layer on its surface. The charging unit 211Y uniformly charges the surface of the photosensitive drum 205Y which rotates around a drum axis. An exposure unit 207Y irradiates the charged surface of the photosensitive drum 205Y with laser light modulated according to image data.

The exposure unit 207Y includes a laser driver which controls the light emission of a semiconductor laser, though it is not illustrated, according to the image data acquired from the CPU 114, a rotating polygon mirror 208Y, and a reflection mirror 209Y. The laser light discharged from the semiconductor laser is swept in a main scanning direction by the rotating polygon mirror 208Y, and is guided to the surface of the photosensitive drum 205Y by the reflection mirror 209Y. By exposing the surface of the photosensitive drum 205Y, an electrostatic latent image is formed.

The developing unit 212Y develops the electrostatic latent image with toner to thereby form a toner image on the photosensitive drum 205Y. A toner image of yellow is formed on the photosensitive drum 205Y of the Y station 220. A toner image of magenta is formed on the photosensitive drum 205M of the M station 221. A toner image of cyan is formed on the photosensitive drum 205C of the C station 222. A toner image of black is formed on the photosensitive drum 205K of the K station 223.

The intermediate transfer belt 252 is wound around rollers of a secondary transfer inner roller 240, etc., to rotate in a clockwise direction in FIG. 1. The respective toner images formed on the photosensitive drums 205Y, 205M, 205C, and 205K are transferred to the rotating intermediate transfer belt 252 to overlap each other. The transfer of the toner images from each photosensitive drums 205Y, 205M, 205C, and 205K to the intermediate transfer belt 252 is performed by applying a bias voltage, which has the opposite characteristic of the toner images, to the intermediate transfer belt 252. Thus, full-color toner images are carried on the intermediate transfer belt 252. The intermediate transfer belt 252 rotates to convey the toner image, which is carried by the intermediate transfer belt 252, to the secondary transfer unit 250. The secondary transfer unit 250 is formed by a secondary transfer inner roller 240 and the secondary transfer outer roller 251.

The sheet feeding unit 140 corresponds to a feeding mechanism for the Sheet S, and includes a storage 210 to store the sheet S, a conveyance path, a conveyance roller, and the like. The sheet feeding unit 140 conveys the sheet S one by one from the storage 210 to the secondary transfer unit 250. The secondary transfer unit 250 conveys the intermediate transfer belt 252 and the sheet S while nipping the intermediate transfer belt 252 and the sheet S between the secondary transfer inner roller 240 and the secondary transfer outer roller 251. At this time, the toner image is transferred from the intermediate transfer belt 252 to the sheet S by applying a bias voltage having a polarity opposite to that of the toner image to the secondary transfer outer roller 251.

The sheet S having the toner images transferred thereon is conveyed to the fixing unit 260, which is a fixing processing mechanism. The fixing unit 260 includes a fixing roller 261 having a heat source inside, a pressure roller 262 to which a bias force toward the fixing roller 261 is applied, and a circuit board 300 which controls a fixing process performed by the fixing unit 260. The fixing unit 260 conveys the sheet S, on which the toner image has been transferred, while nipping the sheet S between the fixing roller 261 and the pressure roller 262. At this time, the fixing roller 261 heats and fuses the toner images, and pressurizes Sheet S between the fixing roller 261 and the pressure roller 262. Thus, the image is fixed on the sheet S.

Thus, the image is printed on the sheet S. In a double-sided printing, the sheet S with the image printed on its first surface is again conveyed to the secondary transfer unit 250 through a reverse path 270. The image forming side of the Sheet S is reversed by being conveyed through the reverse path 270 to the secondary transfer unit 250. After reversing the image forming side of the Sheet S, the image is printed on a second surface, which is different from the first surface, of the sheet S by the secondary transfer unit 250 and the fixing unit 260.

The sheet S with the images printed on both surfaces is discharged out of the image forming apparatus 100 through the image reading unit 290, which is provided downstream of the fixing unit 260 in the conveyance direction of the sheet. The image reading unit 290 is used, in a case where the sheet S is an adjustment image for an image forming condition, for reading the adjustment image.

<Circuit Board>

In order to perform the above image forming processes, the image forming apparatus 100 includes two or more actuators, such as a motor and a sensor in its inside. The actuators are connected to the circuit board to which an electric part for control is implemented. Each electric part implemented to the circuit board is connected by printed wiring. The electric part controls the operations of actuators. Therefore, a plurality of circuit boards are provided in the image forming apparatus 100 corresponding to the actuators. The circuit boards are controlled by the CPU 114. In addition, the controller board 110 to which the CPU 114 is implemented is also an example of the circuit board.

Figure 3:
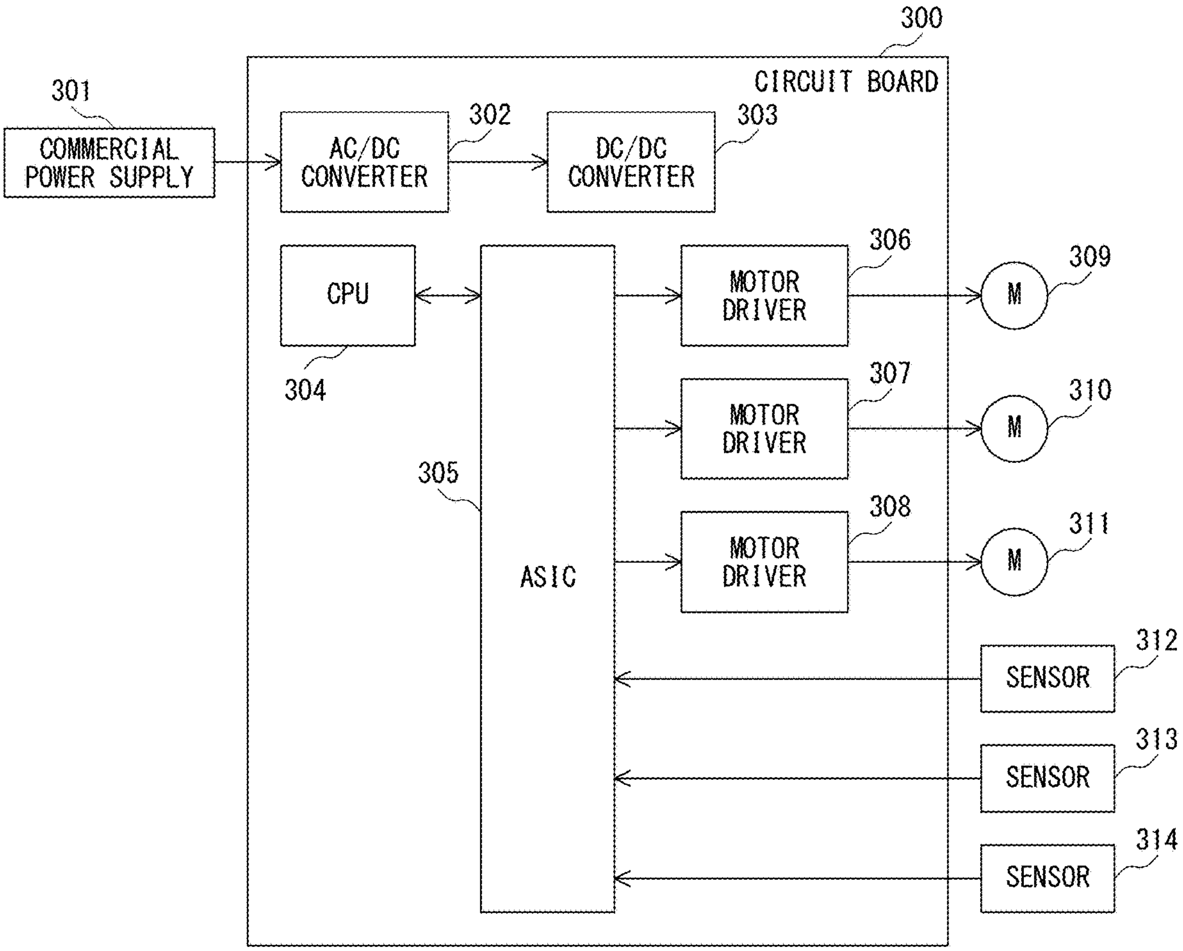
FIG. 3 is a functional block diagram of a circuit board.

FIG. 3 is a functional block diagram of a circuit board 300 provided in the fixing unit 260. A plurality of motors 309-311 in the fixing unit 260 and a plurality of sensors 312-314 in the fixing unit 260 are electrically connected to the circuit board 300. The motor 309 is a drive source for driving the fixing roller 261, which is a rotation member. The motor 310 is a drive source for driving the pressure roller 262 toward the fixing roller 261. The motor 311 is a drive source for driving the roller, which is a rotation member for conveying the sheet S after the fixing process to the subsequent stage. The sensor 312 detects the sheet S conveyed to the fixing unit 260. The sensor 313 detects the temperature of the fixing roller 261. The sensor 314 detects the sheet S after the fixing process.

The circuit board 300 realizes various functions with two or more electric parts. In the example illustrated in FIG. 3, the circuit board 300 includes an AC/DC converter 302 and a DC/DC converter 303 which are used in order to generate the desired voltage from the commercial power supply 301. Furthermore, the circuit board 300 contains a CPU 304, which is used for controlling the actuator, an application specific integrated circuit (ASIC) 305, and motor drivers 306-308. A plurality of integrated circuits (ICs) and a plurality of periphery electric parts, which correspond to the respective ICs, are implemented to the circuit board 300.

The AC/DC converter 302 generates, from the electric power (alternative current) supplied from the commercial power supply 301, a power supply voltage (direct current) having a predetermined voltage value. The DC/DC converter 303 generates, from the power supply voltage (direct current) supplied from the AC/DC converter 302, a power supply voltage (direct current) having a voltage value which is different from the voltage value generated by the AC/DC converter 302. The supply voltage generated by the DC/DC converter 303 is supplied to the CPU 304 and the ASIC 305. The CPU 304 and the ASIC 305 operate with the power supply voltage supplied from the DC/DC converter 303. The power supply voltage output from the AC/DC converter 302 is supplied to the circuit and motors 309-310 which operate with a voltage value different from the voltage value for operating the CPU 304 or ASIC 305.

The CPU 304 is connected to the motor drivers 306-308 and each of sensors 312-314 through the ASIC 305. The CPU 304 acquires a detection result of the sensors 312-314 to thereby detect a state of the fixing unit 260 based on the detection result. The CPU 304 controls the driving of each of the motors 309-311 by controlling each of the motor drivers 306-308 through the ASIC 305 according to the detected state of the fixing unit 260.

Since the circuit board 300 is provided in the fixing unit 260, it controls the operation of the fixing unit 260, and the other circuit boards provided in the image forming apparatus 100 control operations of corresponding component parts, similarly. Each circuit board in the image forming apparatus 100 is communicably connected to the controller board 110. Each circuit board can communicate with each other via the controller board 110. Each circuit board controls appropriately the component parts in the image forming apparatus 100 while mutually sharing the detection result of each sensor and information concerning the control state of the motor.

Two or more electric parts are implemented to the circuit board 300 illustrated in FIG. 3. However, for some electric parts in the two or more electric parts, a situation may arise where procurement becomes difficult. Generally, one solution for the situation where the procurement of the electrical parts becomes difficult is to investigate, as a substitute part, an electric part which has the same or similar shape and specification for each electric part in advance. In a case where a problem has occurred in the procurement of the electrical parts, the manufacture of the circuit board is continued by procuring the substitute parts and implementing the parts to the circuit board.

However, as to a particular IC such as an IC for the DC/DC converter 303 and an IC for the motor driver 306 (or 307, 308), at the time of use, an inherent peripheral part may be needed. Further, since the number of the terminals of the IC, the position of the IC, the arrangement of the IC, or the electric specification of the IC may differ, there may be no substitutable IC. In this case, to address the situation where the procurement of each IC becomes difficult, as to an electrical component including an IC and a peripheral part, another electric part component different from the electrical component but has the same function is separately added to the circuit board to thereby implement the electric part component exclusively. In this method, since an IC which can be procured is implemented according to an acquisition situation of a part to be implemented, it is possible to continue the manufacture of the circuit board.

The circuit board 300 of this embodiment is configured to address the situation where the procurement of the part becomes difficult. Further, the circuit board 300 of this embodiment can suppress the area required for implementing the electric part. Hereinafter, a specific circuit diagram and the wiring (conductor pattern) of the circuit board will be explained.

<Dc/Dc Converter>

Figure 4:
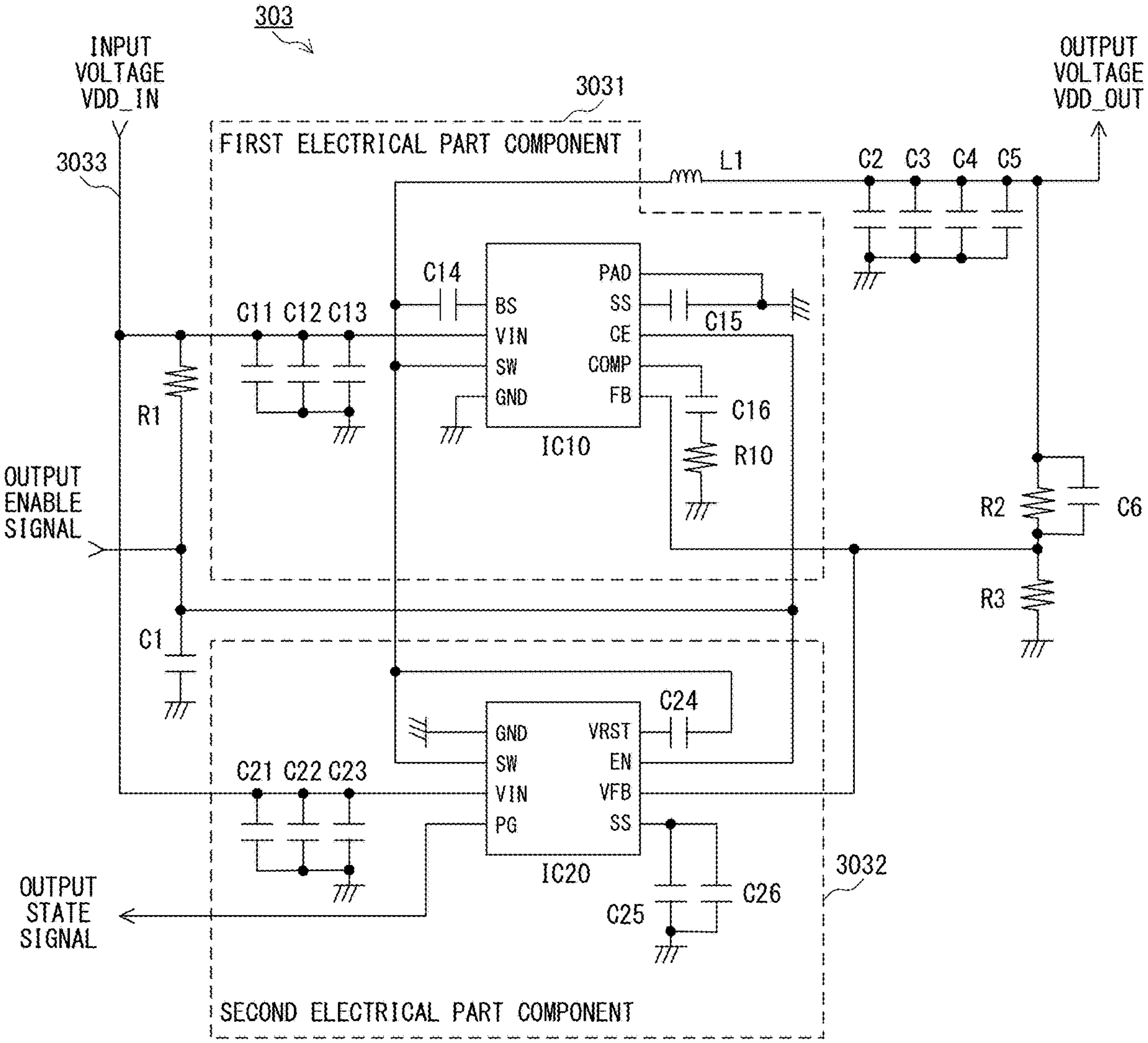
FIG. 4 is a circuit diagram of a DC/DC converter.

FIG. 4 is a circuit diagram of the DC/DC converter 303. As to the DC/DC converter 303, a first electric part component 3031 having an IC 10 and a second electric part component 3032 having an IC 20, which is a part substitutable with the IC 10, are provided exclusively. The DC/DC converter 303 includes an input unit 3033 to which a predetermined power supply voltage is supplied from the AC/DC converter 302. The DC/DC converter 303 transforms, by the first electric part component 3031 or the second electric part component 3032, the supplied power supply voltage into a power supply voltage having a direct current voltage value different from a direct current voltage value of the power supply voltage. In this case, the DC/DC converter 303 transforms a power supply voltage of 12 V to a power supply voltage of 3.3 V and outputs the transformed power supply voltage.

In FIG. 4, an input voltage VDD_IN of 12 V is supplied from the AC/DC converter 302. In a case where the first electric part component 3031 having the IC 10 is implemented, the input voltage VDD_IN is input to No. 2 terminal VIN of the IC 10. Further, in a case where the second electric part component 3032 having the IC 20 is implemented, the input voltage VDD_IN is input to No. 3 terminal VIN of the IC 20. Each of the first electric part component 3031 and the second electric part component 3032 can convert and output the input voltage VDD_IN into an output voltage VDD_OUT, respectively. The function to convert and output the input voltage VDD_IN to the output voltage VDD_OUT is a function common to the IC 10 and the IC 20.

An output enable signal is input to No. 7 terminal CE of the IC 10, or No. 7 terminal EN of the IC 20. The output enable signal is transmitted from the CPU 114 of the controller board 110, for example. As to the IC 10 and the IC 20, the output timing of the output voltage VDD_OUT is controlled by the output enable signal. The IC 10 outputs the output voltage VDD_OUT from No. 3 terminal SW. The IC 20 outputs the output voltage VDD_OUT from No. 2 terminal SW. Each of the IC 10 and the IC 20 has an output control function of the output voltage VDD_OUT by the output enable signal. Further, as to the IC 10, in order to make it possible to output the output voltage VDD_OUT in a case where the input voltage VDD_IN is input and the output enable signal is not input from the CPU 114, the input voltage VDD_IN is supplied to No. 7 terminal CE of IC 10. Similarly, as to the IC 20, in order to make it possible to output the output voltage VDD_OUT in a case where the input voltage VDD_IN is input and the output enable signal is not input from the CPU 114, the input voltage VDD_IN is supplied to No. 7 terminal EN of the IC 20. The circuit board 300 includes, in order to adjust a period until it shifts to a state in which the output voltage VDD_OUT is ready to be output, a resistance R1 and a capacitor C1 as electric parts used in common by the IC 10 and the IC 20.

The IC 20 outputs a signal (output state signal) with which an output state is represented from No. 4 terminal PG. The output function of the output state signal is a function specific to the IC 20, and the IC 10 does not have the same or similar function. The output state signal is a signal which represents whether the IC 20 is outputting the output voltage VDD_OUT normally. The IC 20 outputs an output state signal which represents that it is operating normally in a case where the output voltage VDD_OUT output from No. 2 terminal SW is within a target voltage range. The IC 20 outputs an output state signal which represents that it is not operating normally in a case where the output voltage VDD_OUT output from No. 2 terminal SW is outside the target voltage range. For example, the IC 20 outputs the output state signal of 2.0 V in a case where it is operating normally, and outputs the output state signal of 0.8 V in a case where it is not operating normally.

<Inherent Peripheral Part>

The first electric part component 3031 includes the IC 10 and an inherent peripheral part required for normal operation of the IC 10. The second electric part component 3032 includes the IC 20 and an inherent peripheral part required for normal operation of the IC 20.

The first electric part component 3031 includes capacitors C11, C12, C13, C14, C15, and C16, and a resistance R10 as peripheral parts of the IC 10. The second electric part component 3032 includes capacitors C21, C22, C23, C24, C25, and C26 as peripheral parts of the IC 20. The capacitors C11-C13 of the first electric part component 3031 and the capacitors C21-C23 of the second electric part component 3032 have the common function of removing noise in the input voltage VDD_IN. However, in order to maintain the performance of the IC 10 and the IC 20, the capacitors C11-C13 and the capacitors C21-C23 differ from each other in their capacitance.

In addition, the first electric part component 3031, and the second electric part component 3032 are exclusively implemented to the circuit board 300. However, as for the circuit board 300, the IC 10 and the IC 20 may be implemented exclusively. For example, the peripheral part of the IC 10 and the peripheral part of the IC 20 is implemented previously, and the IC 10 and the IC 20 may be exclusively implemented to the circuit board 300 according to the supply situation of the electric part. Further, as for the first electric part component 3031, the IC 10 and its peripheral part may be configured as one package, and, as for the second electric part component 3032, the IC 20 and its peripheral part may be configured as one package. In this case, the first electric part component 3031, and the second electric part component 3032 are exclusively implemented to the circuit board 300 as a package.

<Common Peripheral Part>

The DC/DC converter 303 also includes an electric part which is commonly used by the IC 10 and the IC 20. The commonly used electric part includes peripheral parts such as the capacitor C1, C2, C3, C4, C5, and C6, the resistance R1, R2, and R3, and inductor L1.

The inductor L1 and the capacitors C2-C5 are connected to an output line of the output voltage VDD_OUT, and have a function of smoothing the output voltage VDD_OUT. The inductor L1 and the capacitors C2-C5 are larger sized parts among the electric parts used in the DC/DC converter 303. As to the circuit board 300 to which the first electric part component 3031 and the second electric part component 3032 are exclusively implemented, in order to reduce waste of the mounting area, it is effective to make the larger sized parts as commonly used electric parts as possible.

The resistance R2 and R3 are voltage divider resistance to divide the output voltage VDD_OUT. The result of the voltage division (divided voltage) by the resistance R2 and R3 of the output voltage VDD_OUT is input to each feedback terminal of the IC 10 and the IC 20. A feedback terminal of the IC 10 is No. 5 terminal FB. A feedback terminal of the IC 20 is No. 6 terminal VFB. The feedback terminal is used in order to monitor whether the output voltage VDD_OUT has reached the target voltage based on the divided voltage. In addition, the capacitor C6 has a function to remove the AC component of the output voltage VDD_OUT.

The IC 10 and the IC 20 determine, based on the divided voltage, whether the output voltage VDD_OUT is being output with a normal voltage value. The IC 10 and the IC 20 short the terminal SW and the terminal VIN inside the IC 10 and the IC 20 in a case where the output voltage VDD_OUT has a voltage value lower than the target voltage. The IC 10 and the IC 20 short the terminal SW and a terminal GND, which is a ground, inside the IC 10 and the IC 20 in a case where the output voltage VDD_OUT has a voltage value higher than the target voltage. Therefore, the divided voltage input to the feedback terminal serves as a reference signal for controlling the output voltage VDD_OUT. Similar to the terminal SW, the feedback terminal is a required terminal in each of the IC 10 and the IC 20. Therefore, the capacitor C6 and the resistances R2 and R3, which generate the divided voltage to be input to the feedback terminal, are the electric parts which are commonly used by the IC 10 and the IC 20.

<Implement Area of Circuit Board>

Figure 5A:
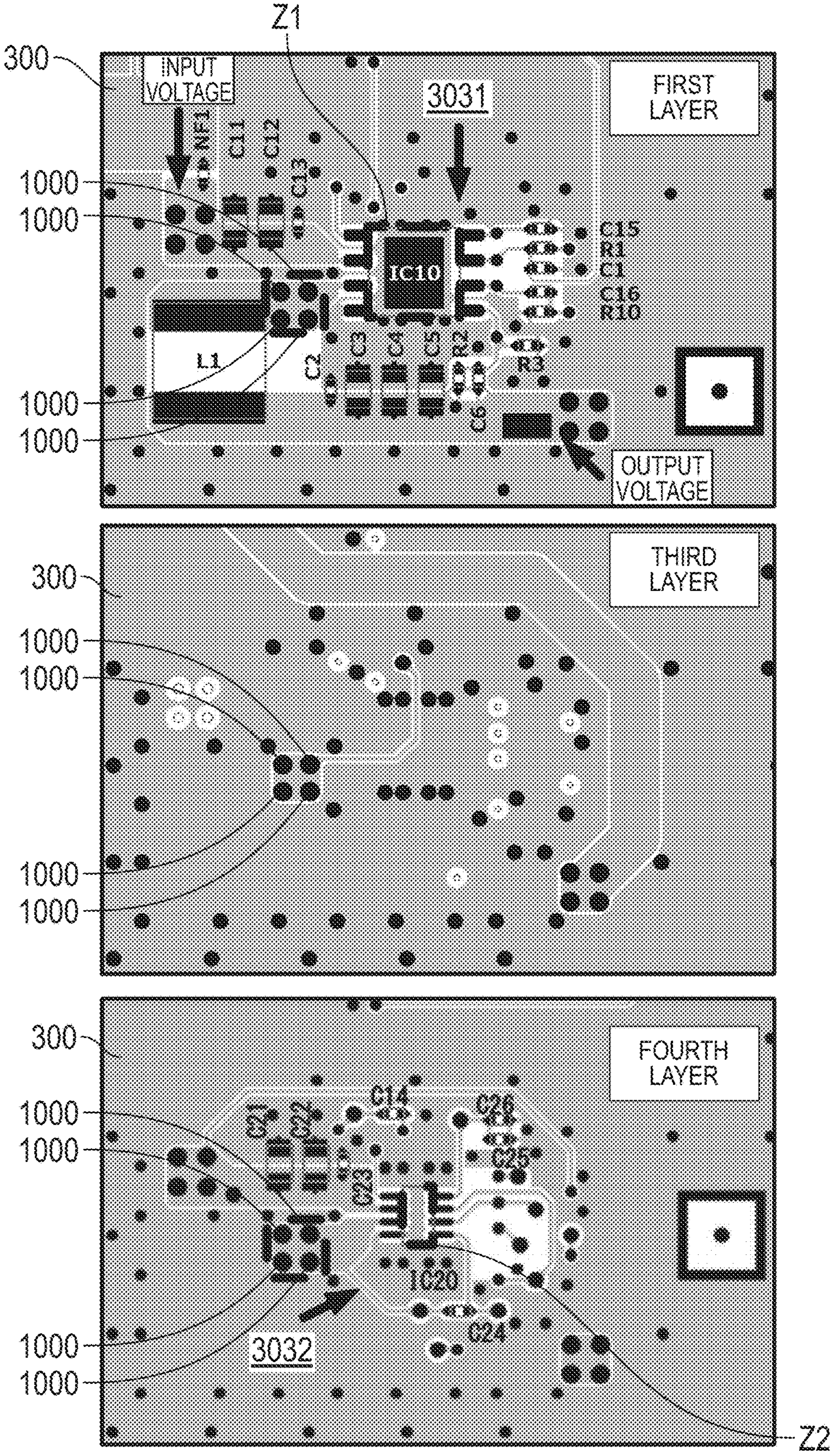
FIG. 5A is an explanatory diagram of the DC/DC converter on the circuit board.
Figure 5B:
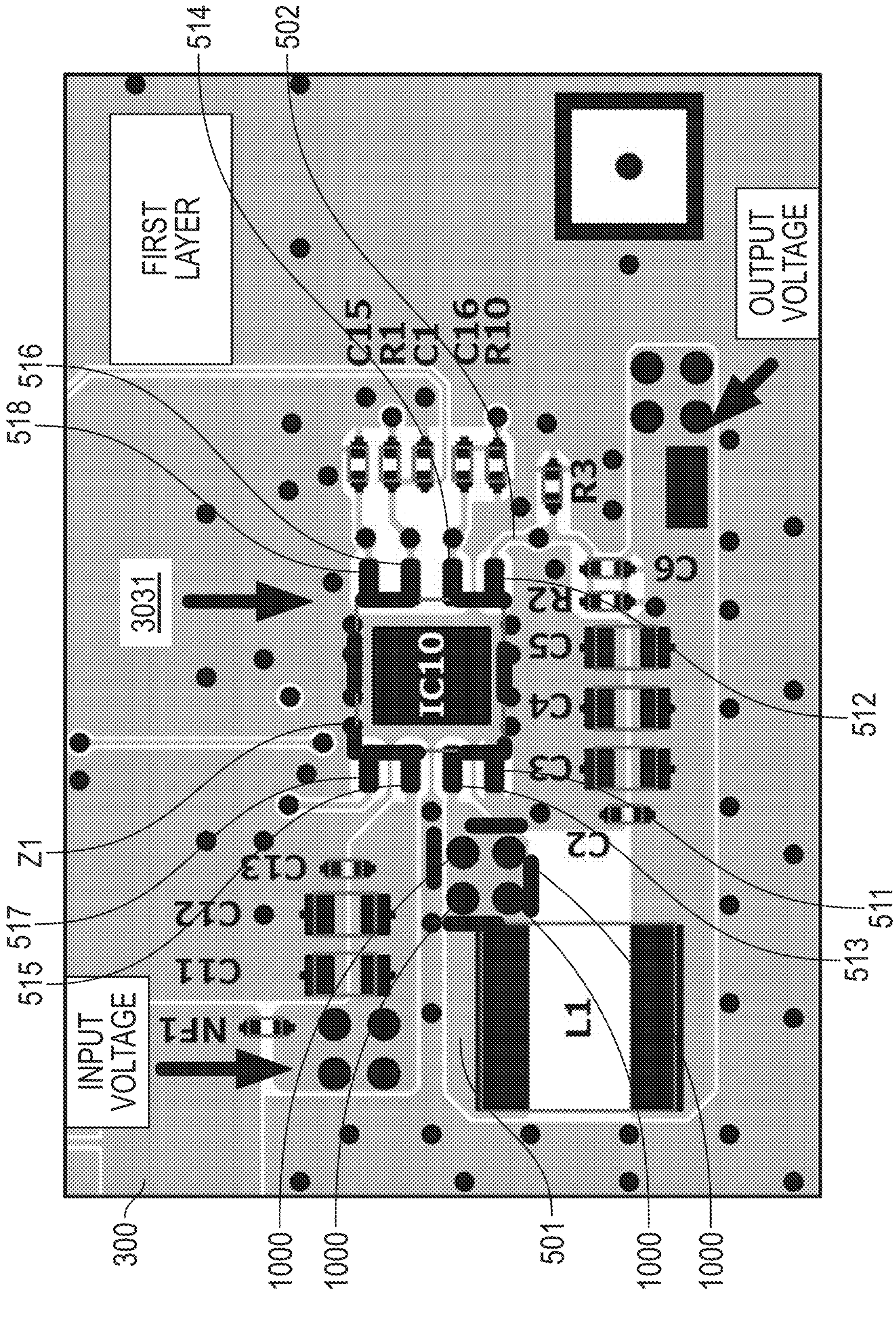
FIG. 5B is an explanatory diagram of the first layer portion of FIG. 5A.
Figure 5C:
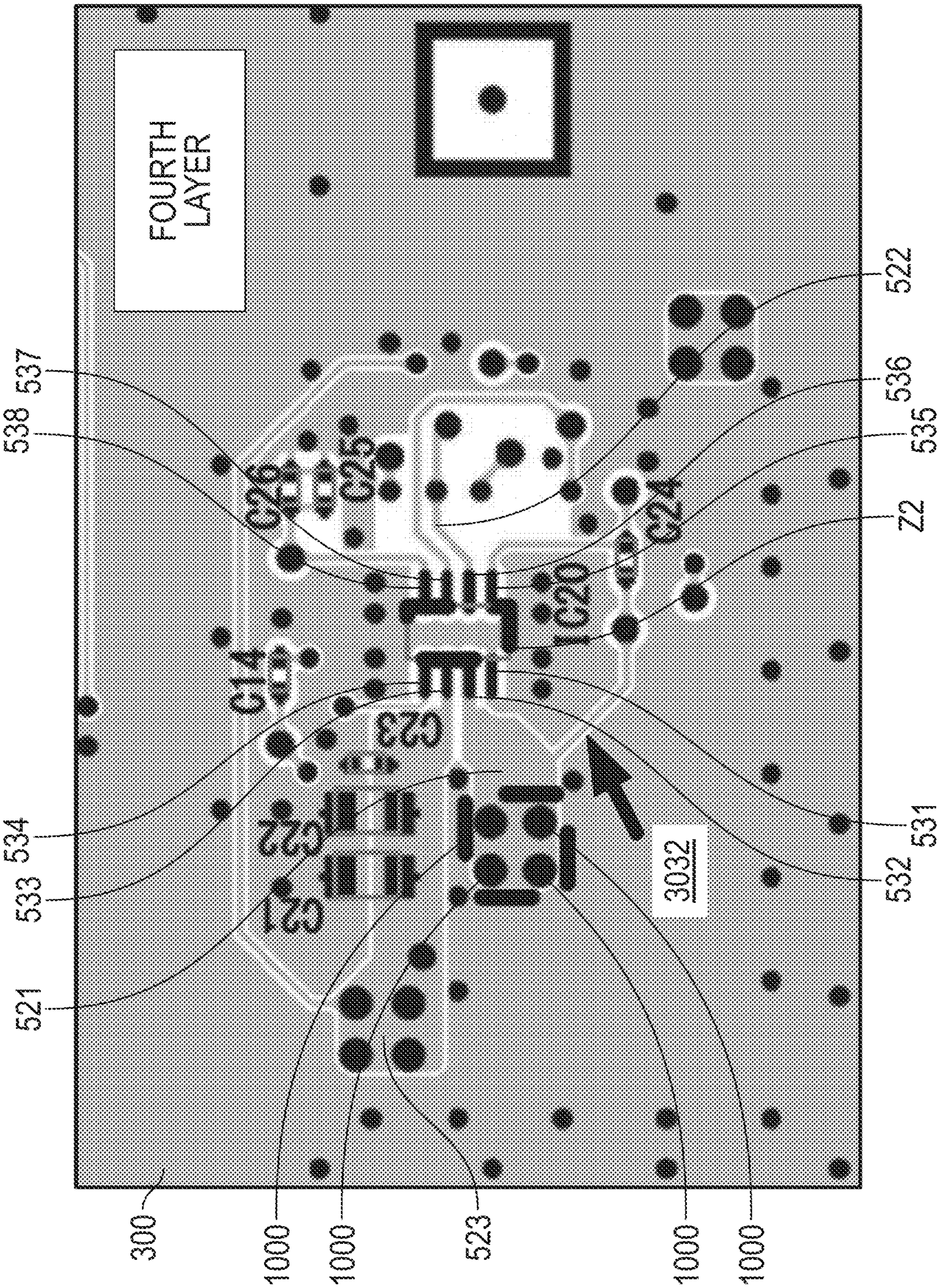
FIG. 5C is an explanatory diagram of the fourth portion layer of FIG. 5A.

FIG. 5A is an explanatory diagram of the DC/DC converter 303 provided on the circuit board 300. FIG. 5B is an explanatory diagram of the first layer portion of FIG. 5A, and FIG. 5C is an explanatory diagram of the fourth layer portion of FIG. 5A. Referring collectively to FIG. 5A, FIG. 5B, and FIG. 5C, the circuit board 300 has a four-layer structure. In FIG. 5A, the first layer, the third layer, and the fourth layer are illustrated. Since the second layer is fully grounded, it is omitted in FIG. 5A. The first layer is a part side (first surface), and a common peripheral part and the first electric part component 3031 are mainly implemented. To the third layer, the wiring (conductor pattern) of the terminal SW, which outputs the output voltage VDD_OUT of the IC 10, and a conductor pattern for grounding are implemented. The fourth layer is a solder side (second surface), and the second electric part component 3032 is mainly implemented. That is, the IC 10 can be implemented to one side (first surface) of the circuit board 300, and the IC 20 can be implemented to another side (second surface) of the circuit board 300. An implementation area of the IC 10 and an implementation area of the IC 20 are arranged at positions opposite each other with the circuit board 300 in between.

In a case where the first implementation area Z1 where the IC 10 is implemented and the second implementation area Z2 where the IC 20 is implemented are projected on a virtual plane parallel to the circuit board 300, the first implementation area Z1 encompasses the second implementation area Z2. Further, in a case where the first implementation area Z1 and the second implementation area Z2 are projected on the virtual plane parallel to the circuit board 300, a portion of the first implementation area Z1 projected on the virtual plane may overlap with the second implementation area Z2 projected on the virtual plane. That is, as to the first implementation area Z1, in a case where the first implementation area Z1 and the second implementation area Z2 are projected on the virtual plane parallel to the circuit board 300, there is a region where these areas overlap in the virtual plane. As compared to a configuration where the IC 10 and the IC 20 are implemented exclusively on the same surface, in the above example, the area required for implementation is reduced, thus, it is possible to suppress the expansion of the area of the circuit board 300.

The inductor L1, the capacitors C1-C6, and the resistances R1-R3, which are common peripheral parts, are implemented to the first layer, which is the part side. Therefore, the IC 10 of the first electric part component 3031 is electrically connected to the inductor L1, the capacitor C6, and the resistances R1-R3 by the wiring (first conductor patterns 501-502) of the first layer. The component side of the circuit board 300 includes eight pads 511-518 as an attachment part to which the terminals of the IC 10 is to be attached. For example, the component side of the circuit board 300 includes the conductor pattern 501 formed so that the inductor L1 and the pad 513 to which No. 3 terminal SW of the IC 10 is attached are electrically connected by the four vias (Vertical Interconnect Access) 1000.

On the other hand, since the IC 20 of the second electric part component 3032 is implemented to the fourth layer which is the solder side, it is electrically connected to the inductor L1 through four vias 1000. Each via 1000 may be provided to penetrate the circuit board 300. The IC 20 of the second electric part component 3032 is electrically connected to the inductor L1, the capacitor C6, and the resistances R1-R3, using the wirings of the fourth layer (second conductor patterns 521-523) as a portion of the wiring. The solder side of the circuit board 300 includes eight pads 531-538 as an attachment part to which the terminals of the IC 20 are to be attached. For example, the solder side of the circuit board 300 includes the conductor pattern 521 formed so that the inductor L1 of the implementation surface and the pad 532 to which No. 2 terminal SW of the IC 20 is attached are electrically connected through four vias 1000.

Further, these four vias 1000 serve as a portion of the wirings for connecting the IC 10 and the capacitor C14 included in the first electric part component 3031. The IC 10 and the capacitor C14 are connected through the third layer. That is, the capacitor C14 of the first electric part component 3031 is implemented to the fourth layer. Thus, the area of the circuit board 300, including the via 1000, is reduced in this embodiment.

Although the second layer is fully grounded, also in the third layer, a large ground area is provided. The second layer provides grounding for the IC 10 of the first layer, and the third layer provides grounding for the IC 20 of the fourth layer. In order to suppress the noise generated from the IC 10 and the IC 20, which are ICs of the DC/DC converter 303, and improve the heat dissipation characteristic, large ground areas are formed in the second layer and the third layer. As to the vias 1000 for connecting the ground area are used in common by the IC 10 and the IC 20 in a case where the vias 1000 are arranged on a straight line through the first layer to the fourth layer. Therefore, the ground area of the second layer and the ground area of the third layer are connected through the vias 1000.

By using the common peripheral parts, the board area occupied by the second electric part component 3032 is about 30 to 40% of the area of the fourth layer, which is the solder side. In a case where it is configured that the first electric part component 3031 and the second electric part component 3032 can be implemented without using the common peripheral part, the board area is increased since an additional commonly usable peripheral electric part is needed for the second electric part component 3032. Particularly, in a case where a larger part is implemented to each of both surfaces of the circuit board 300 by reflow implementation, as to the inductor L1, the possibility of falling, collision, etc., is increased and the yield in implementation may be reduced. Therefore, as to larger parts such as the inductors, it is desirable to arrange the same at one side of the circuit board 300. In a case where the inductor of each unit is arranged respectively on the part side in consideration of the yield in implementation of the circuit board 300, it is estimated that it takes about 1.5 to 2 times the area of wiring (conductor pattern) of FIG. 5.

In this embodiment, the inductor L1, capacitors C1-C6, the resistances R1-R3, and the various vias are treated as common peripheral parts of the IC 10 and the IC 20. Therefore, even in a case where it is configured that two units (the first electric part component 3031 and the second electric part component 3032) can be provided on both surfaces of the circuit board 300, a wasted and unused space on the circuit board 300 due to exclusive implementation can be significantly reduced.

Further, in the above explanation, a description is made for a case where the first implementation area Z1 of the IC 10 is larger than the second implementation area Z2 of the IC 20. However, the circuit board 300 is not limited to the above mentioned configuration. For example, in a case where the second implementation area Z2 of the IC 20 is larger than the first implementation area Z1 of the IC 10, it may be configured that the second implementation area Z2 encompasses the first implementation area Z1 in a case where the first implementation area Z1 and the second implementation area Z2 are projected on a virtual plane parallel to the circuit board 300. Alternatively, in a case where the first implementation area Z1 and the second implementation area Z2 are projected on the virtual plane parallel to the circuit board 300, a portion of the first implementation area Z1 projected on the virtual plane may overlap with the second implementation area Z2 projected on the virtual plane. As compared to a configuration where the IC 10 and the IC 20 are implemented exclusively on the same surface, the area required for implementation is reduced, thus, it is possible to suppress the expansion of the area of the circuit board 300.

Although the DC/DC converter 303 is used as an example as the IC 10 and the IC 20 in the above explanation, even in a case of the IC of the motor driver for controlling the motor drive, it can be configured such that the ICs can be implemented to the part side and the solder side of the circuit board 300, respectively. For example, the IC 10 and the IC 20 are the ICs of a motor driver contained in the motor drivers 306, 307, and 308 which perform drive control of the motors 309, 310, and 311. Due to this configuration, it is possible to significantly reduce the area of wiring (conductor pattern) on the circuit board 300.

As described above, according to the present disclosure, for example, the IC 10 implemented to the circuit board 300 can be easily replaced with another IC 20 which is substitutable for the IC 10.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-135596, filed Aug. 29, 2022, which is hereby incorporated by reference herein in its entirety.

What is claimed is:

1. A circuit board for an image forming apparatuses, the circuit board comprising:

a first electric part mounted on a first surface of the circuit board or on a second surface of the circuit board which is opposite to the first surface;

a first attachment pad provided on the first surface;

a first conductor pattern provided on the first surface and configured to form at least a portion of a first wiring which connects the first attachment pad and the first electric part;

a second attachment pad provided on the second surface;

a second conductor pattern provided on the second surface and configured to form at least a portion of a second wiring which connects the second attachment pad and the first electric part;

an integral circuit having a terminal attached to the first attachment pad; and a connecting via penetrating through the circuit board and electrically connecting the first conductor pattern and the second conductor pattern, wherein the second attachment pad is not attached to any of electric parts.

2. The circuit board according to claim 1, wherein the second attachment pad is configured to be attachable to a terminal of a second integral circuit.

3. The circuit board according to claim 1, further comprising an input portion to which a voltage is input, wherein the integrated circuit is configured to convert a value of the voltage input from the input portion.

4. The circuit board according to claim 1, wherein the integrated circuit is configured to control a drive source that is electrically connected to the circuit board.

5. The circuit board according to claim 1, further comprising:

a first pad group provided on the first surface, including the first attachment pad; and a second pad group provided on the first surface, including the second attachment pad, wherein an arrangement pattern of pads included in the first pad group is different from an arrangement pattern of pads included in the second pad group.

6. The circuit board according to claim 1, further comprising:

a first pad group provided on the first surface, including the first attachment pad; and a second pad group provided on the first surface, including the second attachment pad, wherein a number of pads included in the first pad group is different from a number of pads included in the second pad group.

7. The circuit board according to claim 1, further comprising;

a first area of the first surface where the integrated circuit is arranged; and a second area of the second surface where a second integrated circuit is to be arranged, wherein, in a case where the first area is projected onto the second surface in a direction perpendicular to the first surface, a projection of the first area at least partially overlaps with the second area.

8. An image forming apparatus comprising;

a voltage conversion unit including a circuit board configured to convert a voltage input to the circuit board; and, a control unit configured to control the image forming apparatus based on the voltage converted by the voltage conversion unit, wherein the circuit board includes:

a first electric part mounted on a first surface of the circuit board or on a second surface of the circuit board which is opposite to the first surface, a first attachment pad provided on the first surface, a first conductor pattern provided on the first surface and configured to form at least a portion of a first wiring which connects the first attachment pad and the first electric part, a second attachment pad provided on the second surface, a second conductor pattern provided on the second surface and configured to form at least a portion of a second wiring which connects the second attachment pad and the first electric part, an integral circuit having a terminal attached to the first attachment pad, and a connecting via penetrating through the circuit board and electrically connecting the first conductor pattern and the second conductor pattern, and wherein the second attachment pad is not attached to any of electric parts.

9. The image forming apparatus according to claim 8, wherein the second attachment pad is configured to be attachable to a terminal of a second integral circuit.

10. The image forming apparatus according to claim 8, wherein the circuit board further includes an input portion to which the voltage is input.

11. The image forming apparatus according to claim 8, wherein the circuit board further includes:

a first pad group provided on the first surface, including the first attachment pad; and a second pad group provided on the first surface, including the second attachment pad, and wherein an arrangement pattern of pads included in the first pad group is different from an arrangement pattern of pads included in the second pad group.

12. The image forming apparatus according to claim 8, wherein the circuit board further includes:

a first pad group provided on the first surface, including the first attachment pad; and a second pad group provided on the first surface, including the second attachment pad, and wherein a number of pads included in the first pad group is different from a number of pads included in the second pad group.

13. The image forming apparatus according to claim 8, wherein the circuit board further includes:

a first area of the first surface where the integrated circuit is arranged; and a second area of the second surface where a second integrated circuit is to be arranged, and wherein, in a case where the first area is projected onto the second surface in a direction perpendicular to the first surface, a projection of the first area at least partially overlaps with the second area.

14. An image forming apparatus comprising:

a rotation member configured to rotate to form an image on a sheet;

a drive source; and a circuit board configured to control the drive source that is electrically connected to the circuit board, wherein the circuit board includes:

a first electric part mounted on a first surface of the circuit board or on a second surface of the circuit board which is opposite to the first surface, a first attachment pad provided on the first surface, a first conductor pattern provided on the first surface and configured to form at least a portion of a first wiring which connects the first attachment pad and the first electric part, a second attachment pad provided on the second surface, a second conductor pattern provided on the second surface and configured to form at least a portion of a second wiring which connects the second attachment pad and the first electric part, an integral circuit having a terminal attached to the first attachment pad, and a connecting via penetrating through the circuit board and electrically connecting the first conductor pattern and the second conductor pattern, and wherein the second attachment pad is not attached to any of electric parts.

15. The image forming apparatus according to claim 14, wherein the second attachment pad is configured to be attachable to a terminal of a second integral circuit.

16. The image forming apparatus according to claim 14, wherein the circuit board further includes:

a first pad group provided on the first surface, including the first attachment pad; and a second pad group provided on the first surface, including the second attachment pad, and wherein an arrangement pattern of pads included in the first pad group is different from an arrangement pattern of pads included in the second pad group.

17. The image forming apparatus according to claim 14, wherein the circuit board further includes:

a first pad group provided on the first surface, including the first attachment pad; and a second pad group provided on the first surface, including the second attachment pad, and wherein a number of pads included in the first pad group is different from a number of pads included in the second pad group.

18. The image forming apparatus according to claim 14, wherein the circuit board further includes:

a first area of the first surface where the integrated circuit is arranged; and a second area of the second surface where a second integrated circuit is to be arranged, and wherein, in a case where the first area is projected onto the second surface in a direction perpendicular to the first surface, a projection of the first area at least partially overlaps with the second area.

* * * * *